(12) United States Patent
Barrientos Torres et al.

(10) Patent No.: US 11,982,692 B2
(45) Date of Patent: May 14, 2024

(54) EQUIPMENT AND METHOD FOR IDENTIFYING A FAULT IN THE WINDINGS OF A DISTRIBUTION TRANSFORMER

(71) Applicant: PROLEC, S. A. DE C. V., Nuevo Leon (MX)

(72) Inventors: Juan Angel Barrientos Torres, Nuevo Leon (MX); Berenice Bahena De Leon, Mexico City (MX)

(73) Assignee: PROLEC, S. A. DE C. V., Nuevo Leon (MX)

( * ) Notice: Subject to any disclaimer, the term of this patent is extended or adjusted under 35 U.S.C. 154(b) by 170 days.

(21) Appl. No.: 17/784,705

(22) PCT Filed: Nov. 9, 2020

(86) PCT No.: PCT/IB2020/060529
§ 371 (c)(1),
(2) Date: Jun. 13, 2022

(87) PCT Pub. No.: WO2021/116791
PCT Pub. Date: Jun. 17, 2021

(65) Prior Publication Data
US 2023/0014981 A1    Jan. 19, 2023

(30) Foreign Application Priority Data
Dec. 13, 2019   (MX) .................... MX/a/2019/015169

(51) Int. Cl.
*G01R 15/18*     (2006.01)
*H01F 27/40*     (2006.01)

(52) U.S. Cl.
CPC ......... *G01R 15/181* (2013.01); *H01F 27/402* (2013.01)

(58) Field of Classification Search
CPC ...... G01R 15/181; G01R 31/62; G01R 31/72; H01F 27/402; H01F 38/28; H02J 13/00; H02J 3/00
See application file for complete search history.

(56) References Cited

U.S. PATENT DOCUMENTS

| | | |
|---|---|---|
| 7,738,221 B2 | 6/2010 | Ljubomir et al. |
| 2015/0234016 A1 | 8/2015 | Kampfer |

(Continued)

FOREIGN PATENT DOCUMENTS

| | | |
|---|---|---|
| CA | 2692864 C | 5/2017 |
| WO | 2014130363 A1 | 8/2014 |

OTHER PUBLICATIONS

International Search Report of PCT/IB2020/060529; ISA/CL; Hugo Araya; dated Mar. 8, 2021.

*Primary Examiner* — Jay Patidar
(74) *Attorney, Agent, or Firm* — BCF LLP

(57) ABSTRACT

An apparatus for identifying a fault in the windings of a distribution transformer, a transformer, and an associated method, said device comprising: a first Rogowski current sensor at a high-voltage incoming current terminal, and a second Rogowski current sensor in tandem at a low-voltage outgoing current terminal and at a low-voltage incoming current terminal; a first conductor of the low-voltage outgoing current terminal, passed through in one direction through the second sensor, and a second conductor of the low-voltage incoming current terminal, passed through in the opposite direction through the second sensor; the first and second sensors generate output signals indicating the primary current and the secondary current; both signals are integrated, generating output signals proportional to the primary current and the secondary current, obtaining a (Continued)

transformation ratio, which is compared with a threshold, and sending a fault signal if said threshold is exceeded.

7 Claims, 5 Drawing Sheets

(56) References Cited

U.S. PATENT DOCUMENTS

| | | | | |
|---|---|---|---|---|
| 2015/0349511 A1* | 12/2015 | Kojovic | ................. | G01R 31/40 |
| | | | | 324/764.01 |
| 2017/0115335 A1* | 4/2017 | Pamulaparthy | ........ | G01R 31/52 |
| 2017/0227591 A1* | 8/2017 | Zhang | .................... | G01R 31/52 |
| 2022/0349951 A1* | 11/2022 | Liu | ........................ | G01R 31/40 |

* cited by examiner

EQUIPMENT AND METHOD FOR IDENTIFYING A FAULT IN THE WINDINGS OF A DISTRIBUTION TRANSFORMER

TECHNICAL FIELD OF THE INVENTION

The present invention refers to fault identification systems in electrical distribution transformers, more specifically, it refers to an apparatus and method for identifying a fault in windings of a distribution transformer using a first Rogowski current sensor at a high-voltage incoming current terminal, and a second Rogowski current sensor in tandem at a low-voltage outgoing current terminal and at a low-voltage incoming current terminal.

BACKGROUND OF THE INVENTION

An electrical transformer is used to raise or lower an electrical voltage, that is, the output electrical voltage is the input electrical voltage times an increase factor. This increase factor is generally called the "transformation ratio" and is also known as the "turns ratio." This transformation ratio is defined as the ratio of the electrical voltage in the primary winding and the electrical voltage in the secondary winding for a two-winding transformer, this limit transformation ratio is established during the design of the transformer. Generally, an electrical transformer that raises the electrical voltage will lower the current, while an electrical transformer that lowers the electrical voltage will raise the current. Since power is equal to voltage (electrical tension) times current, the power is the same on both sides of the transformer, ignoring the losses that the electrical transformer could have. In addition to being multiplied by the transformation ratio, the incoming current in an electrical transformer must be equal to the outcoming current of the electrical transformer. A difference between the incoming current of the electrical transformer can indicate a fault within the transformer where the current is diverted into the transformer instead of passing through the transformer.

Currently, a technique used for protection against faults in electrical transformers is called differential protection, which consists of comparing the incoming current of the transformer with the outcoming current of the transformer. One side of an electrical transformer is the primary winding, while the other side is the secondary winding. Usually, the side where the electrical energy enters is through the primary winding. A differential protection system detects the current in the primary winding and detects the current in the secondary winding by using current detectors in the primary winding and the secondary winding. The area between the current detectors is called the protection zone. The differential protection system determines if there is an excessive difference, in addition to the stepping factor, between the two current detectors. If the difference exceeds the allowed differential threshold value, a fault in the protection zone is probable, and then, for example, a protection relay initiates the operation of a circuit breaker or other device to isolate the electrical transformer.

The difference between the current of the primary winding current and the current of the secondary winding that is required to activate the differential protection system and cause the protection relay to operate can be referred to as the differential threshold. A differential protection system with a lower differential threshold may be more sensitive but may be falsely activated by non-fault events.

Generally, current transformers are used in a differential protection system to detect the current of the primary winding and the current of the secondary winding. Current transformers typically have iron cores and can saturate. Current transformer core saturation occurs when more magnetic flux is induced in the current transformer than can be handled by the core. When the current transformer core becomes saturated, it can lose its inductive characteristics allowing currents in the current transformer windings to temporarily cause leakage currents to extremely high levels. Unequal saturation between the current transformer sensing the current in the primary winding and the current transformer sensing the current in the secondary winding of the electrical transformer is an example of a false activation event because no fault is involved.

To avoid erroneously detecting fault conditions for reasons such as current sensor saturation, Rogowski sensors are currently used as current sensors. A Rogowski sensor may comprise a coil of helical or nearly helical wire with the terminal at one end running back through the center of the coil to the other end, such that both terminals are at one end of the coil. The coil can then be formed around a straight conductor where the current in the straight conductor will be measured. The electrical voltage that is induced in the Rogowski sensor coil is proportional to the rate of change of the current in the straight conductor. This rate of change of current is also known as the first-time derivative of current, or di/dt, or change in current with respect to change in time. Thus, the output of the Rogowski sensor can be used to represent di/dt where "i" is the current in the straight conductor to be measured.

Rogowski sensors can provide low inductance and excellent response to rapidly changing currents since they can have gap cores instead of iron cores. Without an iron core to saturate, a Rogowski sensor coil can be highly linear even in high current applications. An example of a current embodiment of a differential protection system that uses a Rogowski sensor as a current sensor in the primary winding and a Rogowski sensor as a current sensor in the secondary winding to measure their respective currents is described in U.S. Pat. No. 7,738,221 B2 of Ljubomir A. Kojovic, et al.

The technique described in the U.S. Pat. No. 7,738,221 B2 requires that the Rogowski sensors be placed inside the distribution transformer tank, specifically in some spiral of the primary winding and the secondary winding, which implies being a non-modular and backward incompatible system with the distribution transformers that are in operation, since the described configuration can only be placed during the manufacturing of the distribution transformer or in major maintenance carried out on a transformer in operation.

In view of the limitation found, it is therefore necessary to offer an apparatus for identifying a fault in windings of a distribution transformer using a first Rogowski current sensor and a second Rogowski current sensor that are directly connected to at least one high-voltage terminal and to the low-voltage phase terminals, respectively, without the need to open the transformer.

SUMMARY OF THE INVENTION

In view of what has been described above and with the purpose of solving the limitations found, it is the object of the invention to offer an apparatus for identifying a fault in windings of a distribution transformer having at least one high-voltage incoming current terminal connected to a primary winding, and at least one low-voltage outgoing current terminal and one low-voltage incoming current terminal connected to a secondary winding, the apparatus includes (a)

first Rogowski current sensor adapted to be placed on a primary conductor connected to a high-voltage incoming current terminal to detect a primary incoming current to the primary winding and generate an output indicative signal of the primary current; (b) a second Rogowski current sensor adapted to be placed in tandem on a first secondary conductor connected to a low-voltage outgoing current terminal and on a second secondary conductor connected to a low-voltage incoming current terminal to detect a total secondary outgoing current of the secondary winding and generate an output indicative signal of the secondary current; (c) an integrating circuit in connection with the first Rogowski current sensor and the second Rogowski current sensor and adapted to receive the output indicative signal of the primary current and the output indicative signal of the secondary current to integrate them and generate an output signal proportional to the primary current and an output signal proportional to the secondary current; (d) a programmable memory for storing and pre-establishing an allowed transformation ratio threshold; (e) a communication module linked to a local or remote monitoring unit; and (f) a controller connected to the integrating circuit, to the programmable memory and to the communication module; wherein the controller is adapted to receive the output signal proportional to the primary current and the output signal proportional to the secondary current to obtain a transformation ratio in operation of the distribution transformer and compare the transformation ratio in operation of the distribution transformer with the allowed transformation ratio threshold of the distribution transformer stored in the programmable memory, and adapted to send a fault signal between windings to the local or remote monitoring unit through the communication module, when the transformation ratio in operation of the distribution transformer exceeds the allowed transformation ratio threshold of the distribution transformer.

It is also an object of the invention to offer a distribution transformer formed by: (a) at least one high-voltage incoming current terminal connected to a primary winding; (b) at least one low-voltage outgoing current terminal and one low-voltage incoming current terminal connected to a secondary winding; (c) a first Rogowski current sensor adapted to be placed on a primary conductor connected to a high-voltage incoming current terminal to detect a primary incoming current to the primary winding and generate an output indicative signal of the primary current; (d) a second Rogowski current sensor adapted to be placed in tandem on a first secondary conductor connected to a low-voltage outgoing current terminal and on a second secondary conductor connected to a low-voltage incoming current terminal to detect a total secondary outgoing current of the secondary winding and generate an output indicative signal of the secondary current; (e) an integrating circuit in connection with the first Rogowski current sensor and the second Rogowski current sensor and adapted to receive the output indicative signal of the primary current and the output indicative signal of the secondary current to integrate them and generate an output signal proportional to the primary current and an output signal proportional to the secondary current; (f) a programmable memory for storing and pre-establishing an allowed transformation ratio threshold; (g) a communication module linked to a local or remote monitoring unit; and (h) a controller connected to the integrating circuit, to the programmable memory and to the communication module; wherein the controller is adapted to receive the output signal proportional to the primary current and the output signal proportional to the secondary current to obtain a transformation ratio in operation of the distribution transformer and compare the transformation ratio in operation of the distribution transformer with the allowed transformation ratio threshold of the distribution transformer stored in the programmable memory, and adapted to send a fault signal between windings to the local or remote monitoring unit through the communication module, when the transformation ratio in operation of the distribution transformer exceeds the allowed transformation ratio threshold of the distribution transformer.

Finally, it is the object of the invention to offer a method for identifying a fault in windings of a distribution transformer having at least one high-voltage incoming current terminal connected to a primary winding, and at least one low-voltage outgoing current terminal and one low-voltage incoming current terminal connected to a secondary winding, The method has the steps of: (a) pre-establishing an allowed transformation ratio threshold for the distribution transformer; (b) detecting, by at least one first Rogowski current sensor, a primary current flowing through a primary conductor connected to a high-voltage incoming current terminal; (c) detecting, by at least one second Rogowski current sensor, a total secondary outgoing current flowing through a first secondary conductor connected to a low-voltage outgoing current terminal and a second secondary conductor connected to a low-voltage incoming current terminal; (d) generating, the first Rogowski current sensor, an output indicative signal of the primary current of the primary winding; (e) generating, the second Rogowski current sensor, an output indicative signal of the secondary current of the secondary winding; (f) integrating the output indicative signal of the primary current and output indicative signal of the secondary current, and generating an output signal proportional to the primary current and an output signal proportional to the secondary current; (g) obtaining a transformation ratio in operation of the distribution transformer; (h) comparing the transformation ratio in operation of the distribution transformer with the allowed transformation ratio threshold; (i) determining if the transformation ratio in operation of the distribution transformer exceeds the allowed transformation ratio threshold; and (j) sending a fault signal between windings to a local or remote monitoring unit, upon determining that the transformation ratio in operation of the distribution transformer exceeds the allowed transformation ratio threshold.

BRIEF DESCRIPTION OF THE DRAWINGS

The characteristic details of the invention are described in the following paragraphs together with the accompanying figures, which are for the purpose of defining the invention but without limiting its scope.

DETAILED DESCRIPTION OF THE INVENTION

Figure 1:
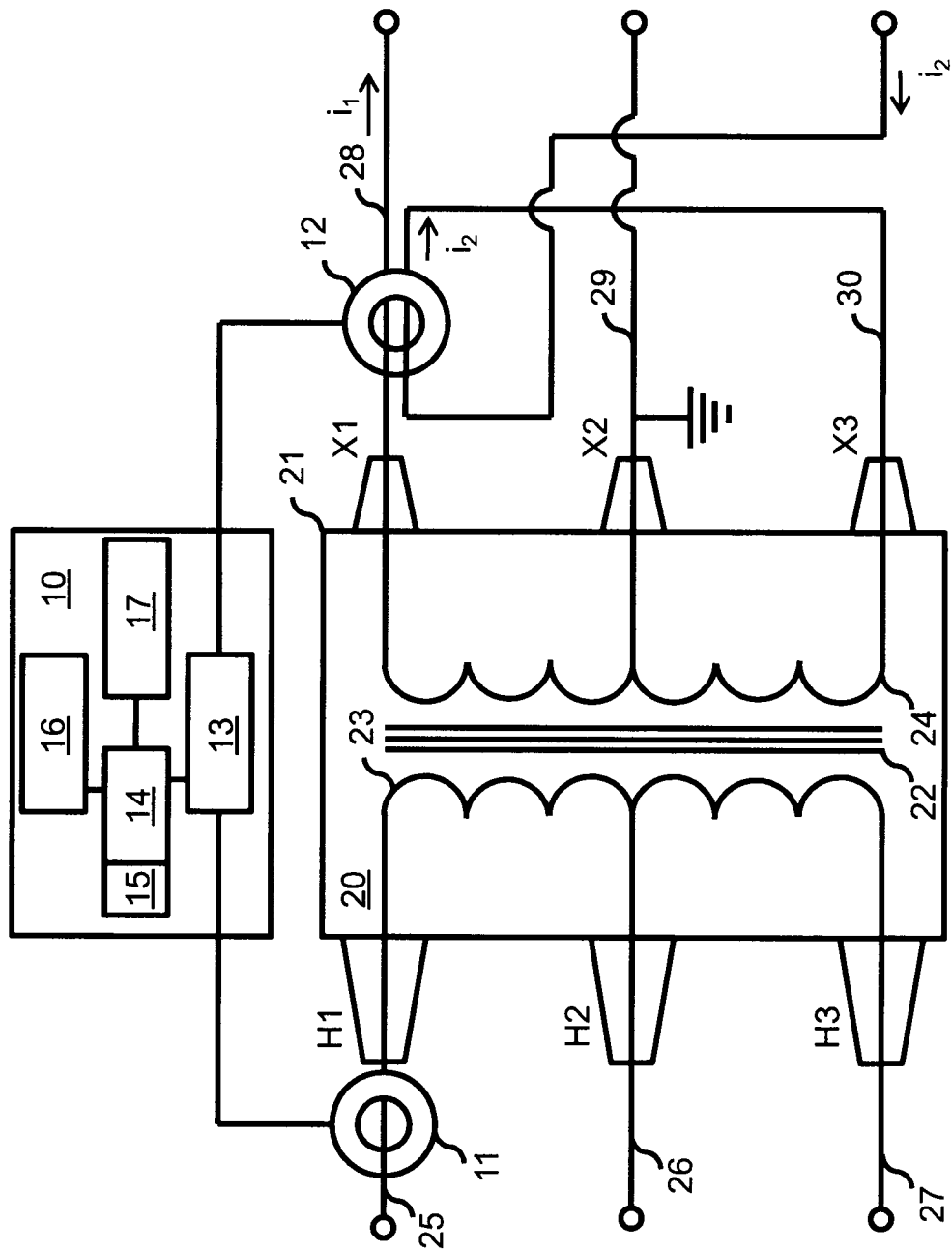
FIG. 1 illustrates a diagram of an apparatus for identifying a fault in windings of a distribution transformer in accordance with a first embodiment of the present invention, which is installed in a prior art distribution transformer.

Referring to FIG. 1, there is shown a diagram illustrating a first embodiment of an apparatus 10 for identifying a fault in windings of a distribution transformer in accordance with the present invention. The apparatus 10 is installed on a distribution transformer 20.

The apparatus 10 is formed by a first Rogowski current sensor 11, a second Rogowski current sensor 12, an integrating circuit 13, a controller 14, a programmable memory 15, a communication module 16 and alternatively includes an user interface module 17. The first Rogowski current sensor 11 and the second Rogowski current sensor 12 are connected to the integrator circuit 13 and this in turn is connected to the controller 14. The programmable memory 15 may be integrated into the controller 14 or in connection with controller 14. Communication module 16 is in connection with controller 14 and in wired or wireless communication with a local or remote monitoring unit (not shown). Also, the user interface module 17 is in connection with the controller 14.

The distribution transformer 20 of the present embodiment may be a three-phase transformer that may comprise a tank 21 inside which there is a core 22, a primary winding 23 and a secondary winding 24, and external to the tank there are high-voltage terminals (H1, H2 and H3) connected to the primary winding 23, where H1 is a high-voltage incoming current terminal, and on the other hand low-voltage terminals (X1, X2 and X3) connected to the secondary winding 24, where X1 is a low-voltage outgoing current terminal and X3 is an low-voltage incoming current terminal. The high-voltage terminals (H1, H2 and H3) have in turn connected a primary conductor 25, 26 and 27, respectively; while the low-voltage outgoing current terminal X1 has a first secondary conductor 28 connected, the low-voltage incoming current terminal X3 has a second secondary conductor 30 connected and the low-voltage terminal X2 has a secondary conductor 29 connected.

The first Rogowski current sensor 11 is adapted to be placed at the high-voltage incoming current terminal H1, in particular, around the primary conductor 25 in order to detect a primary incoming current $i_0$ flowing through the primary conductor 25, generating an output indicative signal of the primary current which may be proportional to the first-time derivative of the primary incoming current flowing from the primary conductor 25 to the primary winding 23.

The second Rogowski current sensor 12 is adapted to be placed in tandem at the low-voltage outgoing current terminal X1 and the low-voltage incoming current terminal X3, in particular around the first secondary conductor 28 and the second secondary conductor 30, in such a way that two different currents pass in the opposite direction in the second Rogowski current sensor 12, in order to detect a total secondary outgoing current flowing through the first secondary conductor 28 and the second secondary conductor 30, generating an output indicative signal that corresponds to a sum of the secondary outgoing current $i_1$ flowing through the first secondary conductor 28 and the secondary incoming current $i_2$ flowing through the second secondary conductor 30 and that can be proportional to the first derivative with respect to time of total secondary outgoing current flowing through the first secondary conductor 28 and the second secondary conductor 30 from the secondary winding 24. To get the second Rogowski current sensor 12 to detect a total secondary outgoing current of the secondary winding 24 based on the secondary outgoing current $i_1$ flowing through the first secondary conductor 28 and the secondary incoming current $i_2$ flowing through the second secondary conductor 30, the first secondary conductor 28 is passed in one direction through the second Rogowski current sensor 12, while the second secondary conductor 30 is passed in the opposite direction through the second Rogowski current sensor 12 so that the secondary outgoing current $i_1$ flowing through the first secondary conductor 28 and the secondary incoming current $i_2$ flowing through the second secondary conductor 30 pass in the same direction through the second Rogowski current sensor 12.

The integrating circuit 13 in connection with the first Rogowski current sensor 11 and the second Rogowski current sensor 12 is adapted to receive the output indicative signal of the primary current generated by the first Rogowski current sensor 11 and the corresponding output indicative signal of the secondary current generated by the second Rogowski current sensor 12 to integrate them and generate an output signal proportional to the primary current and an output signal proportional to the secondary current. The integrating circuit 13 performs a summation process called "integration". The output voltage of the integrator circuit 13 is proportional to the area under the input curve (input wave), for any instant. The integrator circuit 13 may be monolithic, hybrid thin layer, hybrid thick layer, or any combination thereof.

In the programmable memory 15 is stored and pre-established an allowed transformation ratio threshold, this transformation ratio threshold should generally correspond to the design transformation ratio established at the time of manufacture of the distribution transformer 20. The programmable memory 15 can be, for example, a Random Access Memory (RAM), Read Only Memory (ROM), Static Random Access Memory (SRAM), virtual or SWAP memory, Electrically Erasable Programmable Read-Only Memory (EEPROM), or any combination thereof.

The controller 14 is connected to the integrating circuit 13, to the programmable memory 15, to the communication module 16 and to the user interface module 17. The controller 14 is adapted to receive the output signal proportional to the primary current and the output signal proportional to the secondary current generated by the integrating circuit 13 to obtain a transformation ratio in operation of the distribution transformer 20 and compare the transformation ratio in operation of the distribution transformer 20 with the allowed transformation ratio threshold stored and pre-established in the programmable memory 15, and when the transformation ratio in operation of the distribution transformer 20 exceeds the pre-established transformation ratio threshold, then the controller 14 sends an alert signal indicating, for example, "fault between windings" to the local or remote monitoring unit (not shown) via the communication module 16. The controller 14 may comprise a microprocessor, a microcontroller, a digital signal processor, an analog signal processor circuit, an Application-Specific Integrated Circuit (ASIC), a Field Programmable Gate Array (FPGA), a System on a Chip (SoC), a Complex Programmable Logic Device (CPLD), Digital Logic, Combination Logic, Sequential Logic, any other computing device, logic device, state machine, or any combination thereof. Controller 14 may comprise software, firmware, hardware, or any combination thereof.

The communication module 16 has at least one wireless or wired remote communication interface served by the telecommunications network, preferably data packet technology to access the Internet network in order to be able to send and/or receive data messages to and from the local or remote monitoring unit (not shown). Examples of wireless communication technology that may be employed by the remote communication interface are General Packet Radio Service, Enhanced Data Rates for the Evolution of GSM, Code Division Multiple Access 2000, Universal Mobile Telecommunications System, Freedom of Mobile Multimedia Access, Wideband Code Division Multiple Access, Time Division Synchronous CDMA Technology, High Speed Packet Downstream Access, High Speed Packet Upstream Access, Radio Frequency (RFiD), IEEE 802.15.4 interface, and their combinations. In another embodiment, the communication module 16 has at least one wireless or wired short-range communication interface, preferably using packet data technology, such as WiFi, WLAN, Bluetooth and their combinations.

Alternatively, the user interface module 17 may be mounted on the apparatus 10 or be separate to the apparatus 10, but in connection and communication with the controller 14. Typically, through the user interface module 17, a user it may select various operating characteristics and modes of operation, and monitor the operation of apparatus 10. In certain exemplary embodiments, user interface module 17 may represent a General-Purpose Input/Output (GPIO) device or functional block. User interface module 17 may also include input components, such as one or more of a variety of mechanical or electromechanical or electrical input devices, including USB ports, rotary knobs, push buttons, and touch pads. The user interface module 17 may further include a display component, such as a digital or analog display device designed to provide operational information of apparatus 10 to a user.

Figure 2:
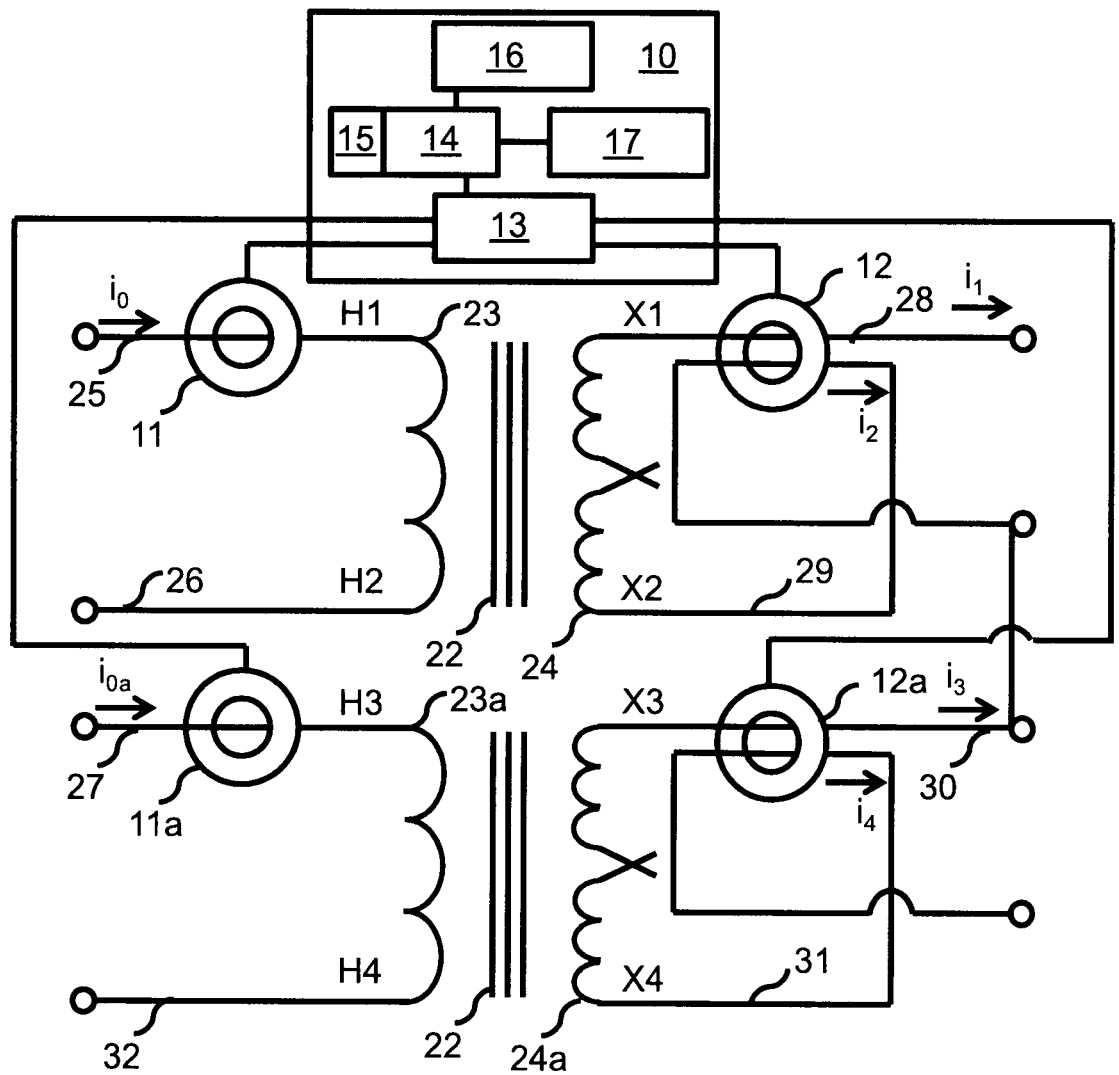
FIG. 2 illustrates a diagram of an apparatus for identifying a fault in windings of a distribution transformer in accordance with a second embodiment of the present invention, which is installed in a prior art two-phase distribution transformer.

Referring to FIG. 2, there is shown a diagram illustrating a second embodiment of an apparatus 10 for identifying a fault in windings of a distribution transformer in accordance with the present invention. The apparatus 10 is installed on a two-phase distribution transformer 20.

The apparatus 10 is formed by two first Rogowski current sensors 11 and 11a, two second Rogowski current sensors 12 and 12a, an integrating circuit 13, a controller 14, a programmable memory 15, a communication module 16 and alternatively includes an user interface module 17. The first Rogowski current sensors 11 and 11a and the second Rogowski current sensors 12 and 12a are connected to the integrating circuit 13 and this in turn is connected to the controller 14. Programmable memory 15 may be integrated into controller 14 or in connection with controller 14. Communication module 16 is in connection with controller 14 and in wired or wireless communication with a local or remote monitoring unit (not displayed). Also, the user interface module 17 is in connection with the controller 14.

The two-phase distribution transformer 20 of the present embodiment may comprise a tank (not shown) inside which is a core 22, two primary windings 23 and 23a (connected in series or parallel) and two secondary windings 24 and 24a (connected in series or parallel), and external to the tank (not shown) are high-voltage terminals (H1, H2, H3 and H4), where the high-voltage terminals H1 and H2 are connected to the primary winding 23, the high-voltage terminals H3 and H4 are connected to primary winding 23a, and where H1 and H3 are high-voltage incoming current terminals high-voltage terminals of incoming currents $i_0$ y $i_{0a}$, respectively; and on the other hand, low-voltage terminals (X1, X2, X3 and X4), where the low-voltage terminal X1 is connected to one end of the secondary winding 24 and the low-voltage terminal X2 is connected to the other end of the secondary winding 24, the low-voltage terminal X3 is connected to one end of the secondary winding 24a and the low-voltage terminal X4 is connected to the other end of the secondary winding 24a, i.e. X1 and X2 are in phase and X3 and X4 are in phase; and where X1 and X3 are low-voltage outgoing current terminals of outgoing current $i_1$ and $i_3$, respectively, and X2 and X4 are low-voltage incoming current terminals of incoming current $i_2$ and $i_4$, respectively.

The high-voltage terminals (H1, H2, H3 and H4) have in turn connected a primary conductor 25, 26, 27 and 32, respectively; while the low-voltage outgoing current terminal X1 has a first secondary conductor 28 connected, the low-voltage incoming current terminal X2 has a second secondary conductor 29 connected, the low-voltage outgoing current terminal X3 has a first secondary conductor 30 connected, and the low-voltage incoming current terminal X4 has a second secondary conductor 31 connected.

At the high-voltage incoming current terminal H1, the first Rogowski current sensor 11 is placed, and at the high-voltage incoming current terminal H3, the other first Rogowski current sensor 11a is placed, in particular around the primary conductors 25 and 27, respectively, in order to detect a primary incoming current $i_0$ flowing through the primary conductor 25 and a primary incoming current $i_{0'}$ flowing through the primary conductor 27 by generating an output indicative signal of the primary current which may be proportional to the first-time derivative of the total primary incoming current flowing in the primary conductor 25 and the primary conductor 27 to primary windings 23 and 23a.

At the low-voltage outgoing current terminal X1 and the low-voltage incoming current terminal X2, the second Rogowski current sensor 12 is jointly placed, and at the low-voltage outgoing current terminal X3 and the low-voltage incoming current terminal X4, the other second Rogowski current sensor 12a is jointly placed, in particular, the second Rogowski current sensor 12 is placed around the first secondary conductor 28 and the second secondary conductor 29, while the second Rogowski current sensor 12a is placed around the first secondary conductor 30 and the second secondary conductor 31, in such a way that two different currents pass in opposite directions both in the second Rogowski current sensor 12 and in the other second Rogowski current sensor 12a, in order to detect a total secondary outgoing current that flows through the secondary conductors 28, 29, 30 and 31, generating an output indicative signal corresponding to a summation of the secondary outgoing current $i_1$ flowing through the first secondary conductor 28, the secondary incoming current $i_2$ flowing through second secondary conductor 29, the secondary outgoing current $i_3$ flowing through the first secondary conductor 30 and the secondary incoming current $i_4$ flowing through second secondary conductor 31, and which may be proportional to the first-time derivative of the total secondary outgoing current flowing in secondary conductors 28, 29, 30 and 31 from secondary windings 24 and 24a.

In order to make both second Rogowski current sensors 12 and 12a jointly detect a total secondary outgoing current from the secondary windings 24 and 24a based on the secondary outgoing current $i_1$ flowing through the first secondary conductor 28, the secondary incoming current $i_2$ flowing through the second secondary conductor 29, the secondary outgoing current $i_3$ flowing through the first secondary conductor 30 and the secondary incoming current $i_4$ flowing through the second secondary conductor 31, the first secondary conductor 28 is passed in one direction through of the second Rogowski current sensor 12 and the second secondary conductor 29 is passed in the opposite direction through the second Rogowski current sensor 12, and the first secondary conductor 30 is passed in one direction through the second Rogowski current sensor 12a and the second secondary conductor 31 is passed in the opposite direction through the second Rogowski current sensor 12a, all this with the purpose that the secondary outgoing current $i_1$ flowing through the first secondary conductor 28 and the secondary incoming current $i_2$ flowing through the second secondary conductor 29 pass in the same direction through the second Rogowski current sensor 12, while the secondary outgoing current $i_3$ flowing through the first secondary conductor 30 and the secondary incoming current $i_4$ flowing through the second secondary conductor 31 pass in the same direction through the second Rogowski current sensor 12a.

The integrating circuit 13 in connection with the first Rogowski current sensors 11 and 11a and with the second Rogowski current sensors 12 and 12a is adapted to receive the output indicative signal of the primary current generated by the first Rogowski current sensors 11 and 11a and the output indicative signal corresponding to the sum of the secondary current generated by the second Rogowski current sensors 12 and 12a to integrate them and generate an output signal proportional to the primary current and an output signal proportional to the secondary current. The integrating circuit 13 performs a summation process called "integration". The output voltage of the integrator circuit 13 is proportional to the area under the input curve (input wave), for any instant. The integrator circuit 13 may be monolithic, hybrid thin layer, hybrid thick layer, or any combination thereof.

Regarding the controller 14, the programmable memory 15, the communication module 16 and the user interface module 17, these technical elements retain the same configuration described above with respect to FIG. 1.

Figure 3:
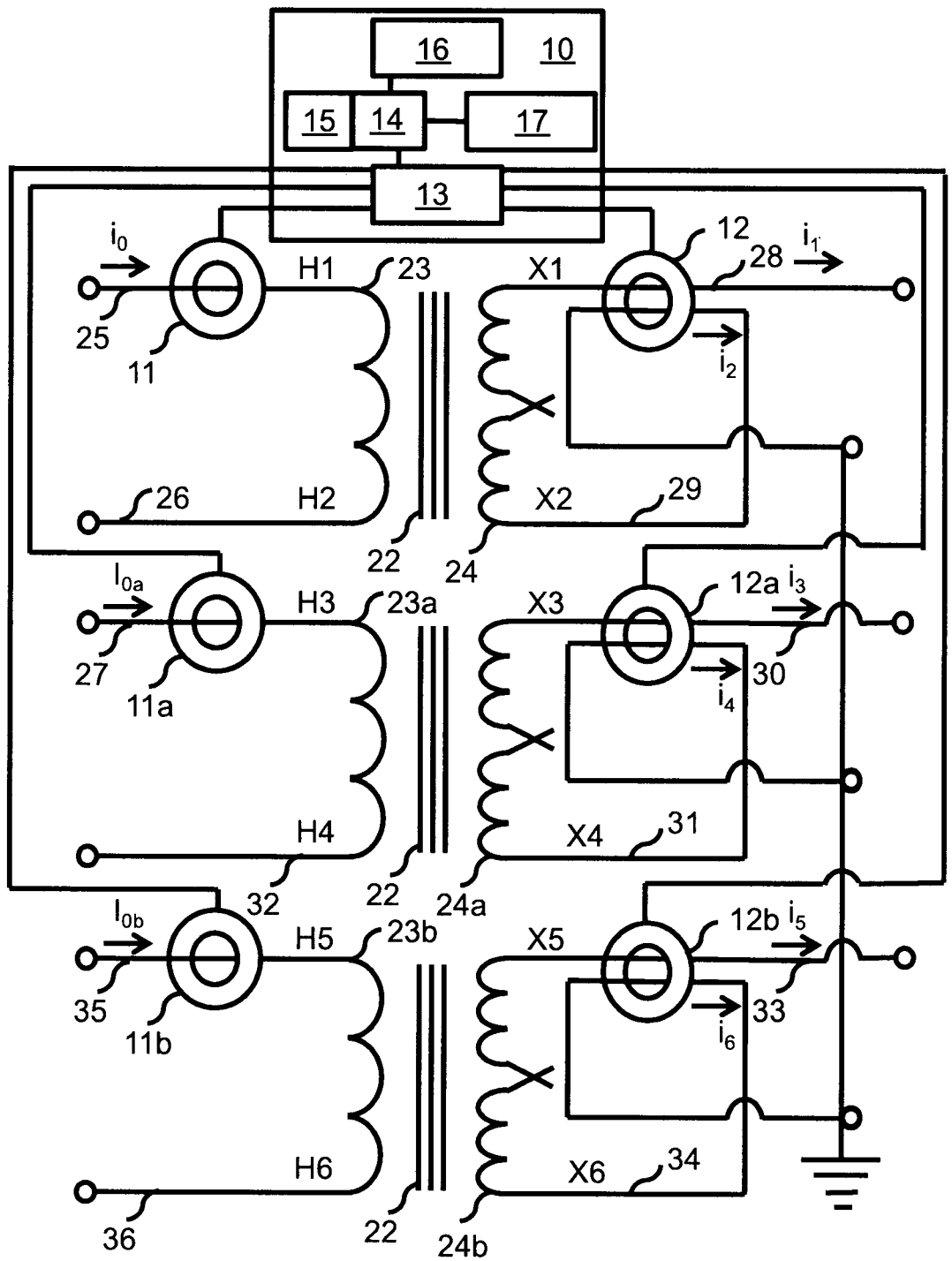
FIG. 3 illustrates a diagram of an apparatus for identifying a fault in windings of a distribution transformer in accordance with a third embodiment of the present invention, which is installed in a prior art three-phase distribution transformer.

Referring to FIG. 3, there is shown a diagram illustrating a third embodiment of an apparatus 10 for identifying a fault in windings of a distribution transformer in accordance with the present invention. The apparatus 10 is installed on a three-phase distribution transformer 20.

The apparatus 10 is formed by three first Rogowski current sensors 11, 11a and 11b, three second Rogowski current sensors 12, 12a and 12b, an integrating circuit 13, a controller 14, a programmable memory 15, a communication module 16 and alternatively includes an user interface module 17. The first Rogowski current sensors 11, 11a and 11b and the second Rogowski current sensors 12, 12a and 12b are connected to the integrating circuit 13 and this in turn is connected to the controller 14. Programmable memory 15 may be integrated into controller 14 or in connection with controller 14. Communication module 16 is in connection with controller 14 and in wired or wireless communication with a local or remote monitoring unit (not displayed). Also, the user interface module 17 is in connection with the controller 14.

The three-phase distribution transformer 20 of the present embodiment may comprise a tank (not shown) inside which is a core 22, three primary windings 23, 23a and 23b (connected in series or parallel) and three secondary windings 24, 24a and 24b (connected in series or parallel), and external to the tank (not shown) are high-voltage terminals (H1, H2, H3, H4, H5 and H6), where the high-voltage terminals H1 and H2 are connected to the primary winding 23, the high-voltage terminals H3 and H4 are connected to primary winding 23a and the high-voltage terminals H5 and H6 are connected to the primary winding 23b, and where H1, H3 and H5 are high-voltage incoming current terminals high-voltage terminals of incoming currents $i_0$, $i_{0a}$ y $i_{0b}$, respectively; and on the other hand, low-voltage terminals (X1, X2, X3, X4, X5 and X6), where the low-voltage terminal X1 is connected to one end of the secondary winding 24 and the low-voltage terminal X2 is connected to the other end of the secondary winding 24, the low-voltage terminal X3 is connected to one end of the secondary winding 24a, the low-voltage terminal X4 is connected to the other end of the secondary winding 24a, and the low-voltage terminal X5 is connected to one end of the secondary winding 24b, the low-voltage terminal X6 is connected to the other end of the secondary winding 24b, i.e. X1 and X2 are in phase, X3 and X4 are in phase, and X5 and X6 are in phase; and where X1, X3 and X5 are low-voltage outgoing current terminals of outgoing current $i_1$, $i_3$ and $i_5$, respectively, and X2, X4 and X6 are low-voltage incoming current terminals of incoming current $i_2$, $i_4$ and $i_6$, respectively.

The high-voltage terminals (H1, H2, H3, H4, H5 and H6) have in turn connected a primary conductor 25, 26, 27, 32, 35 and 36, respectively; while the low-voltage outgoing current terminal X1 has a first secondary conductor 28 connected, the low-voltage incoming current terminal X2 has a second secondary conductor 29 connected, the low-voltage outgoing current terminal X3 has a first secondary conductor 30 connected, the low-voltage incoming current terminal X4 has a second secondary conductor 31 connected, the low-voltage outgoing current terminal X5 has a first secondary conductor 33 connected, and the low-voltage incoming current terminal X6 has a second secondary conductor 34 connected At the high-voltage incoming current terminal H1, the first Rogowski current sensor 11 is placed, at the high-voltage incoming current terminal H3, the other first Rogowski current sensor 11a is placed, and at the high-voltage incoming current terminal H5, the other first Rogowski current sensor 11b is placed, in particular around the primary conductors 25, 27 and 35, respectively, in order to detect a primary incoming current $i_0$ flowing through the primary conductor 25, a primary incoming current $i_{0a}$ flowing through the primary conductor 27, and a primary incoming current $i_{0b}$ flowing through the primary conductor 35 by generating an output indicative signal of the primary current which may be proportional to the first-time derivative of the total primary incoming current flowing in the primary conductor 25, the primary conductor 27, and the primary conductor 35 to primary windings 23, 23a and 23b.

At the low-voltage outgoing current terminal X1 and the low-voltage incoming current terminal X2, the second Rogowski current sensor 12 is jointly placed, at the low-voltage outgoing current terminal X3 and the low-voltage incoming current terminal X4, the other second Rogowski current sensor 12a is jointly placed, and at the low-voltage outgoing current terminal X5 and the low-voltage incoming current terminal X6, the other second Rogowski current sensor 12b is jointly placed, in particular, the second Rogowski current sensor 12 is placed around the first secondary conductor 28 and the second secondary conductor 29, the other second Rogowski current sensor 12a is placed around the first secondary conductor 30 and the second secondary conductor 31, and the other second Rogowski current sensor 12b is placed around the first secondary conductor 33 and the second secondary conductor 34, in such a way that two different currents pass in opposite directions both in the second Rogowski current sensor 12, in the other second Rogowski current sensor 12a, and in the other second Rogowski current sensor 12b, in order to detect a total secondary outgoing current that flows through the secondary conductors 28, 29, 30, 31, 33 and 34, generating an output indicative signal corresponding to a summation of the secondary outgoing current $i_1$ flowing through the first secondary conductor 28, the secondary incoming current $i_2$ flowing through second secondary conductor 29, the secondary outgoing current $i_3$ flowing through the first secondary conductor 30, the secondary incoming current $i_4$ flowing through second secondary conductor 31, and the secondary outgoing current $i_5$ flowing through the first secondary conductor 33, the secondary incoming current $i_6$ flowing through second secondary conductor 34, and which may be proportional to the first-time derivative of the total secondary outgoing current flowing in secondary conductors 28, 29, 30, 31, 33 and 34 from secondary windings 24, 24a and 24b.

In order to make the three second Rogowski current sensors 12, 12a and 12b jointly detect a total secondary outgoing current from the secondary windings 24, 24a and 24b based on the secondary outgoing current $i_1$ flowing through the first secondary conductor 28, the secondary incoming current $i_2$ flowing through the second secondary conductor 29, the secondary outgoing current $i_3$ flowing through the first secondary conductor 30, the secondary incoming current $i_4$ flowing through the second secondary conductor 31, and the secondary outgoing current $i_5$ flowing through the first secondary conductor 33, the secondary incoming current $i_6$ flowing through the second secondary conductor 34, the first secondary conductor 28 is passed in one direction through of the second Rogowski current sensor 12 and the second secondary conductor 29 is passed in the opposite direction through the second Rogowski current sensor 12, the first secondary conductor 30 is passed in one direction through the second Rogowski current sensor 12a and the second secondary conductor 31 is passed in the opposite direction through the second Rogowski current sensor 12a, and the first secondary conductor 33 is passed in one direction through the second Rogowski current sensor 12b and the second secondary conductor 34 is passed in the opposite direction through the second Rogowski current sensor 12b, all this with the purpose that the secondary outgoing current $i_1$ flowing through the first secondary conductor 28 and the secondary incoming current $i_2$ flowing through the second secondary conductor 29 pass in the same direction through the second Rogowski current sensor 12, the secondary outgoing current $i_3$ flowing through the first secondary conductor 30 and the secondary incoming current $i_4$ flowing through the second secondary conductor 31 pass in the same direction through the second Rogowski current sensor 12a, and the secondary outgoing current $i_5$ flowing through the first secondary conductor 33 and the secondary incoming current $i_6$ flowing through the second secondary conductor 34 pass in the same direction through the second Rogowski current sensor 12b.

The integrating circuit 13 in connection with the first Rogowski current sensors 11, 11a and 11b and with the second Rogowski current sensors 12, 12a y 12b is adapted to receive the output indicative signal of the primary current generated by the first Rogowski current sensors 11, 11a and 11b, and the output indicative signal corresponding to the sum of the secondary current generated by the second Rogowski current sensors 12, 12a and 12b to integrate them and generate an output signal proportional to the primary current and an output signal proportional to the secondary current. The integrating circuit 13 performs a summation process called "integration". The output voltage of the integrator circuit 13 is proportional to the area under the input curve (input wave), for any instant. The integrator circuit 13 may be monolithic, hybrid thin layer, hybrid thick layer, or any combination thereof.

Regarding the controller 14, the programmable memory 15, the communication module 16 and the user interface module 17, these technical elements retain the same configuration described above with respect to FIG. 1.

Figure 4:
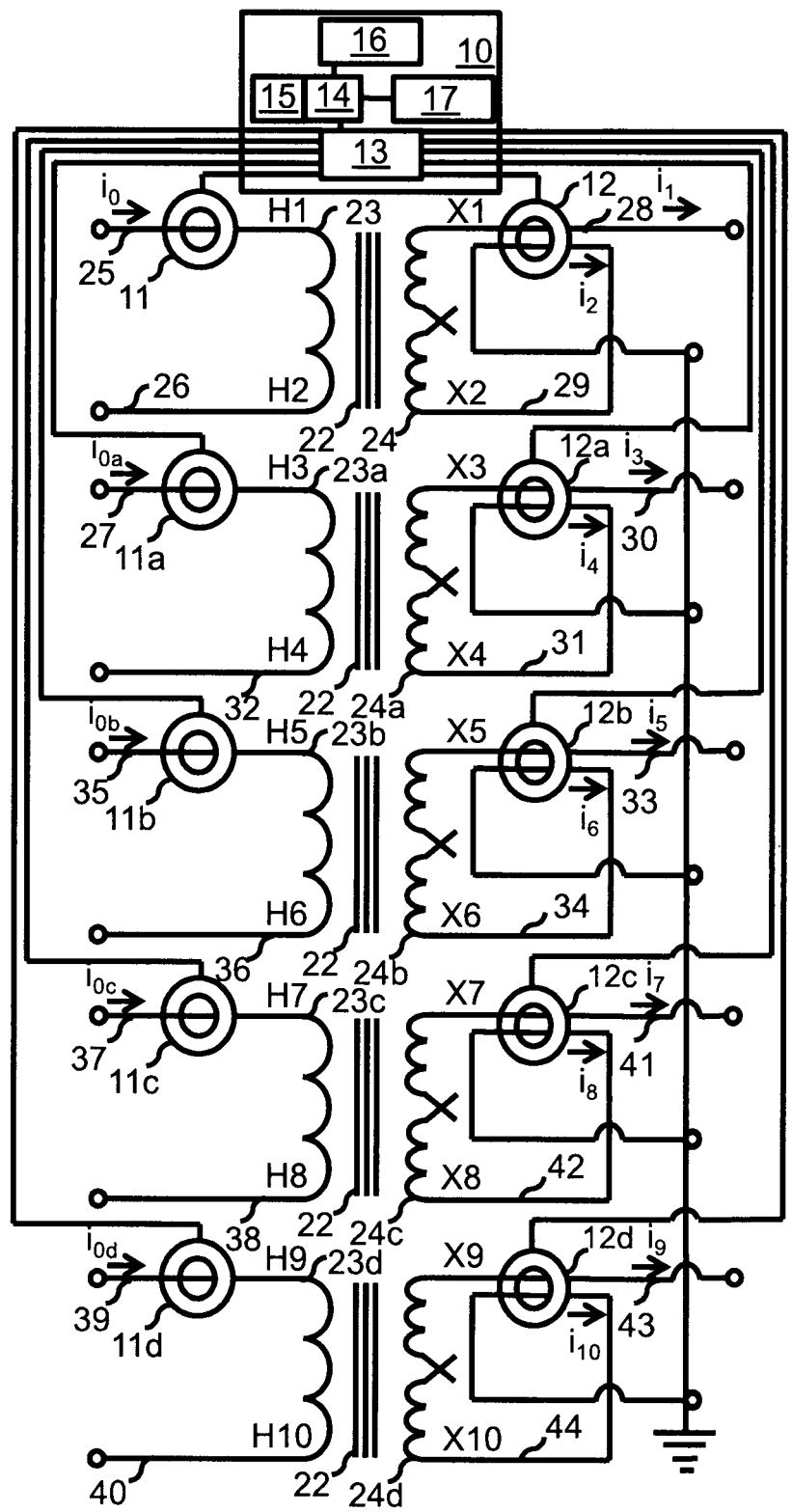
FIG. 4 illustrates a diagram of an apparatus for identifying a fault in windings of a distribution transformer in accordance with a fourth embodiment of the present invention, which is installed in a prior art five-phase distribution transformer.

Referring to FIG. 4, there is shown a diagram illustrating a third embodiment of an apparatus 10 for identifying a fault in windings of a distribution transformer in accordance with the present invention. The apparatus 10 is installed on a five-phase distribution transformer 20.

The apparatus 10 is formed by five first Rogowski current sensors 11, 11a, 11b, 11c and 11d, five second Rogowski current sensors 12, 12a, 12b, 12c and 12d, an integrating circuit 13, a controller 14, a programmable memory 15, a communication module 16 and alternatively includes an user interface module 17. The first Rogowski current sensors 11, 11a, 11b, 11c and 11d and the second Rogowski current sensors 12, 12a, 12b, 12c and 12d are connected to the integrating circuit 13 and this in turn is connected to the controller 14. Programmable memory 15 may be integrated into controller 14 or in connection with controller 14. Communication module 16 is in connection with controller 14 and in wired or wireless communication with a local or remote monitoring unit (not displayed). Also, the user interface module 17 is in connection with the controller 14.

The five-phase distribution transformer 20 of the present embodiment may comprise a tank (not shown) inside which is a core 22, five primary windings 23, 23a, 23b, 23c and 23d (connected in series or parallel) and five secondary windings 24, 24a, 24b, 24c and 24d (connected in series or parallel), and external to the tank (not shown) are high-voltage terminals (H1, H2, H3, H4, H5, H6, H7, H8, H9 and H10), where the high-voltage terminals H1 and H2 are connected to the primary winding 23, the high-voltage terminals H3 and H4 are connected to primary winding 23a, the high-voltage terminals H5 and H6 are connected to primary winding 23b, the high-voltage terminals H7 and H8 are connected to primary winding 23c, and the high-voltage terminals H9 and H10 are connected to the primary winding 23d, and where H1, H3, H5, H7 and H9 are high-voltage incoming current terminals high-voltage terminals of incoming currents $i_0$, $i_{0a}$, $i_{0b}$, $i_{0c}$ and $i_{0d}$, respectively; and on the other hand, low-voltage terminals (X1, X2, X3, X4, X5, X6, X7, X8, X9 y X10), where the low-voltage terminal X1 is connected to one end of the secondary winding 24 and the low-voltage terminal X2 is connected to the other end of the secondary winding 24, the low-voltage terminal X3 is connected to one end of the secondary winding 24a, the low-voltage terminal X4 is connected to the other end of the secondary winding 24a, the low-voltage terminal X5 is connected to one end of the secondary winding 24b, the low-voltage terminal X6 is connected to the other end of the secondary winding 24b, the low-voltage terminal X7 is connected to one end of the secondary winding 24c, the low-voltage terminal X8 is connected to the other end of the secondary winding 24c, and the low-voltage terminal X9 is connected to one end of the secondary winding 24d, the low-voltage terminal X10 is connected to the other end of the secondary winding 24d, i.e. X1 and X2 are in phase, X3 and X4 are in phase, X5 and X6 are in phase, X7 and X8 are in phase, and X9 and X10 are in phase; and where X1, X3, X5, X7 and X9 are low-voltage outgoing current terminals of outgoing current $i_1$, $i_3$, $i_5$, $i_7$ and $i_9$, respectively, and X2, X4, X6, X8 and X10 are low-voltage incoming current terminals of incoming current $i_2$, $i_4$, $i_6$, $i_8$ e $i_{10}$, respectively.

The high-voltage terminals (H1, H2, H3, H4, H5, H6, H7, H8, H9 and H10) have in turn connected a primary conductor 25, 26, 27, 32, 35, 36, 37, 38, 39 y 40, respectively; while the low-voltage outgoing current terminal X1 has a first secondary conductor 28 connected, the low-voltage incoming current terminal X2 has a second secondary conductor 29 connected, the low-voltage outgoing current terminal X3 has a first secondary conductor 30 connected, the low-voltage incoming current terminal X4 has a second secondary conductor 31 connected, the low-voltage outgoing current terminal X5 has a first secondary conductor 33 connected, the low-voltage incoming current terminal X6 has a second secondary conductor 34 connected, the low-voltage outgoing current terminal X7 has a first secondary conductor 41 connected, the low-voltage incoming current terminal X8 has a second secondary conductor 42 connected, and the low-voltage outgoing current terminal X9 has a first secondary conductor 43 connected, the low-voltage incoming current terminal X10 has a second secondary conductor 44 connected.

At the high-voltage incoming current terminal H1, the first Rogowski current sensor 11 is placed, at the high-voltage incoming current terminal H3, the other first Rogowski current sensor 11a is placed, at the high-voltage incoming current terminal H5, the other first Rogowski current sensor 11b is placed, at the high-voltage incoming current terminal H7, the other first Rogowski current sensor 11c is placed, and at the high-voltage incoming current terminal H9, the other first Rogowski current sensor 11d is placed, in particular around the primary conductors 25, 27, 35, 37 and 39, respectively, in order to detect a primary incoming current $i_0$ flowing through the primary conductor 25, a primary incoming current $i_{0a}$ flowing through the primary conductor 27, a primary incoming current $i_{0b}$ flowing through the primary conductor 35, a primary incoming current $i_{0c}$ flowing through the primary conductor 37, and a primary incoming current $i_{0d}$ flowing through the primary conductor 39 by generating an output indicative signal of the primary current which may be proportional to the first-time derivative of the total primary incoming current flowing in the primary conductor 25, the primary conductor 27, the primary conductor 35, the primary conductor 37, and the primary conductor 39 to primary windings 23, 23a, 23b, 23c and 23d.

At the low-voltage outgoing current terminal X1 and the low-voltage incoming current terminal X2, the second Rogowski current sensor 12 is jointly placed, at the low-voltage outgoing current terminal X3 and the low-voltage incoming current terminal X4, the other second Rogowski current sensor 12a is jointly placed, at the low-voltage outgoing current terminal X5 and the low-voltage incoming current terminal X6, the other second Rogowski current sensor 12b is jointly placed, at the low-voltage outgoing current terminal X7 and the low-voltage incoming current terminal X8, the other second Rogowski current sensor 12c is jointly placed, and at the low-voltage outgoing current terminal X9 and the low-voltage incoming current terminal X10, the other second Rogowski current sensor 12d is jointly placed, in particular, the second Rogowski current sensor 12 is placed around the first secondary conductor 28 and the second secondary conductor 29, the other second Rogowski current sensor 12a is placed around the first secondary conductor 30 and the second secondary conductor 31, the other second Rogowski current sensor 12b is placed around the first secondary conductor 33 and the second secondary conductor 34, the other second Rogowski current sensor 12c is placed around the first secondary conductor 41 and the second secondary conductor 42, and the other second Rogowski current sensor 12d is placed around the first secondary conductor 43 and the second secondary conductor 44, in such a way that two different currents pass in opposite directions both in the second Rogowski current sensor 12, in the other second Rogowski current sensor 12a, in the other second Rogowski current sensor 12b, in the other second Rogowski current sensor 12c, and in the other second Rogowski current sensor 12d, in order to detect a total secondary outgoing current that flows through the secondary conductors 28, 29, 30, 31, 33, 34, 41, 42, 43 and 44, generating an output indicative signal corresponding to a summation of the secondary outgoing current $i_1$ flowing through the first secondary conductor 28, the secondary incoming current $i_2$ flowing through second secondary conductor 29, the secondary outgoing current $i_3$ flowing through the first secondary conductor 30, the secondary incoming current $i_4$ flowing through second secondary conductor 31, the secondary outgoing current $i_5$ flowing through the first secondary conductor 33, the secondary incoming current $i_6$ flowing through second secondary conductor 34, the secondary outgoing current $i_7$ flowing through the first secondary conductor 41, the secondary incoming current $i_8$ flowing through second secondary conductor 42, and the secondary outgoing current $i_9$ flowing through the first secondary conductor 43, the secondary incoming current ho flowing through second secondary conductor 44, and which may be proportional to the first-time derivative of the total secondary outgoing current flowing in secondary conductors 28, 29, 30, 31, 33, 34, 41, 42, 43 and 44 from secondary windings 24, 24a, 24b, 24c and 24d.

In order to make the three second Rogowski current sensors 12, 12a, 12b, 12c and 12d jointly detect a total secondary outgoing current from the secondary windings 24, 24a, 24b, 24c and 24d based on the secondary outgoing current $i_1$ flowing through the first secondary conductor 28, the secondary incoming current $i_2$ flowing through the second secondary conductor 29, the secondary outgoing current $i_3$ flowing through the first secondary conductor 30, the secondary incoming current $i_4$ flowing through the second secondary conductor 31, the secondary outgoing current $i_5$ flowing through the first secondary conductor 33, the secondary incoming current $i_6$ flowing through the second secondary conductor 34, the secondary outgoing current $i_7$ flowing through the first secondary conductor 41, the secondary incoming current $i_8$ flowing through the second secondary conductor 42, and the secondary outgoing current $i_9$ flowing through the first secondary conductor 43, the secondary incoming current ho flowing through the second secondary conductor 44, the first secondary conductor 28 is passed in one direction through of the second Rogowski current sensor 12 and the second secondary conductor 29 is passed in the opposite direction through the second Rogowski current sensor 12, the first secondary conductor 30 is passed in one direction through the second Rogowski current sensor 12a and the second secondary conductor 31 is passed in the opposite direction through the second Rogowski current sensor 12a, the first secondary conductor 33 is passed in one direction through the second Rogowski current sensor 12b and the second secondary conductor 34 is passed in the opposite direction through the second Rogowski current sensor 12b, the first secondary conductor 41 is passed in one direction through the second Rogowski current sensor 12c and the second secondary conductor 42 is passed in the opposite direction through the second Rogowski current sensor 12c, and the first secondary conductor 43 is passed in one direction through the second Rogowski current sensor 12d and the second secondary conductor 44 is passed in the opposite direction through the second Rogowski current sensor 12d, all this with the purpose that the secondary outgoing current $i_1$ flowing through the first secondary conductor 28 and the secondary incoming current $i_2$ flowing through the second secondary conductor 29 pass in the same direction through the second Rogowski current sensor 12, the secondary outgoing current $i_3$ flowing through the first secondary conductor 30 and the secondary incoming current $i_4$ flowing through the second secondary conductor 31 pass in the same direction through the second Rogowski current sensor 12a, the secondary outgoing current $i_5$ flowing through the first secondary conductor 33 and the secondary incoming current $i_6$ flowing through the second secondary conductor 34 pass in the same direction through the second Rogowski current sensor 12b, the secondary outgoing current $i_7$ flowing through the first secondary conductor 41 and the secondary incoming current $i_8$ flowing through the second secondary conductor 42 pass in the same direction through the second Rogowski current sensor 12c, and the secondary outgoing current $i_9$ flowing through the first secondary conductor 43 and the secondary incoming current ho flowing through the second secondary conductor 44 pass in the same direction through the second Rogowski current sensor 12d.

The integrating circuit 13 in connection with the first Rogowski current sensors 11, 11a, 11b, 11c and 11d and with the second Rogowski current sensors 12, 12a, 12b, 12c and 12d is adapted to receive the output indicative signal of the primary current generated by the first Rogowski current sensors 11, 11a, 11b, 11c and 11d, and the output indicative signal corresponding to the sum of the secondary current generated by the second Rogowski current sensors 12, 12a, 12b, 12c and 12d to integrate them and generate an output signal proportional to the primary current and an output signal proportional to the secondary current. The integrating circuit 13 performs a summation process called "integration". The output voltage of the integrator circuit 13 is proportional to the area under the input curve (input wave), for any instant. The integrator circuit 13 may be monolithic, hybrid thin layer, hybrid thick layer, or any combination thereof.

Regarding the controller 14, the programmable memory 15, the communication module 16 and the user interface module 17, these technical elements retain the same configuration described above with respect to FIG. 1.

From the embodiments described above, it follows that the apparatus 10 for identifying a fault in windings of a distribution transformer in accordance with the present invention is applicable to any configuration and number of phases of the distribution transformer 20.

Figure 5:
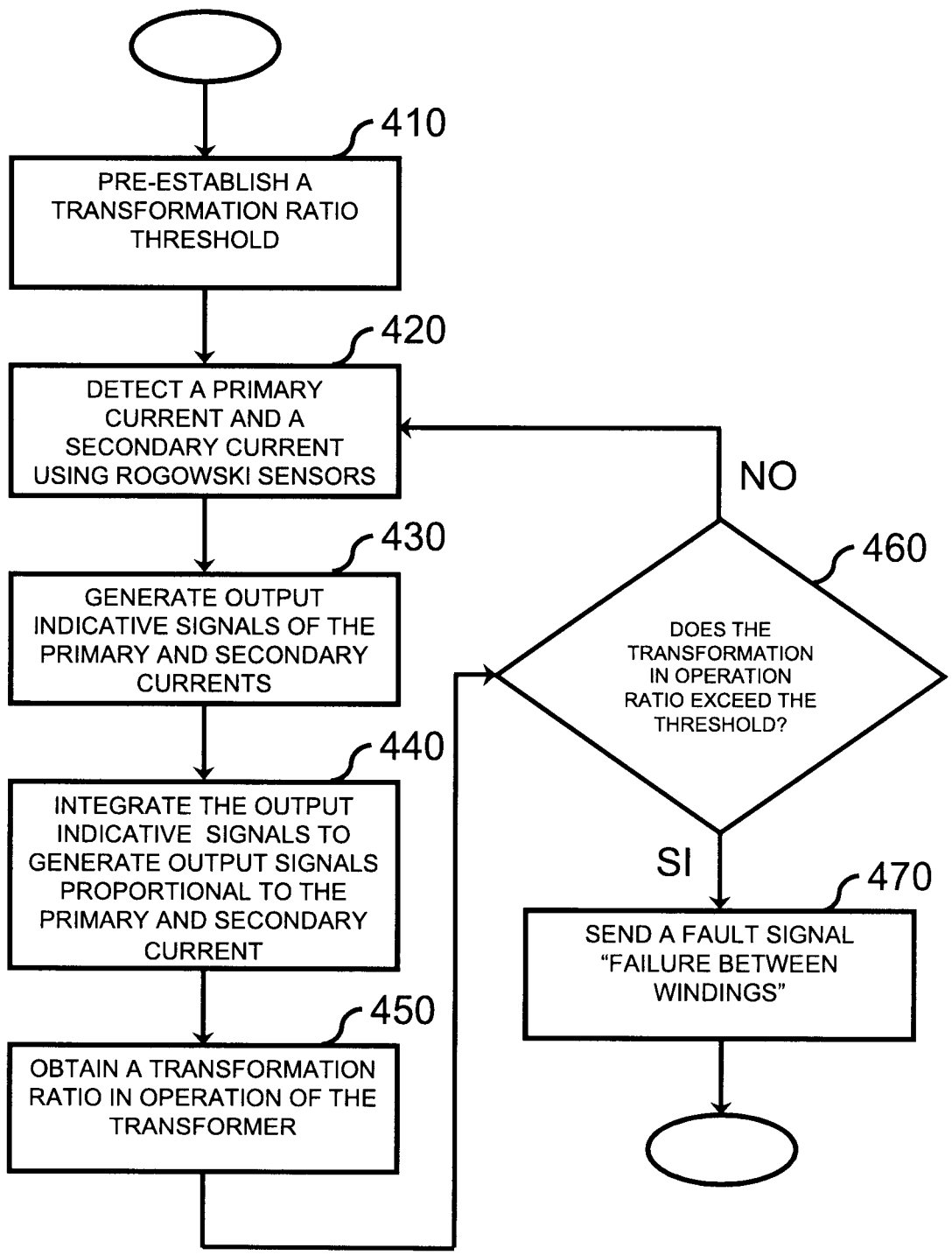
FIG. 5 illustrates a flow chart of a method for identifying a fault in windings of a distribution transformer in accordance with embodiments of the present invention.

Referring now to FIG. 5, there is shown a flowchart of a method 400 for identifying a fault in windings of a distribution transformer in accordance with the first example embodiment of the present invention shown in FIG. 1. Certain steps in the method or method flow referenced hereinafter naturally precedes others for the invention to function as described. However, the invention is not limited to the order of steps described if such order or sequence does not alter the functionality of the invention. That is, it is recognized that some steps may be performed before, after, or in parallel with other steps without departing from the scope or spirit of the invention.

In step 410, the transformation ratio threshold for distribution transformer 20 is pre-established in a programmable memory 15.

In step 420, the current flowing in the primary conductor 25 can be detected by means of the first Rogowski current sensor 11, and the total secondary current flowing through the first secondary conductor 28 and the second secondary conductor 30 can be detected by means of the second Rogowski current sensor 12. The electrical voltage induced in the respective Rogowski current sensors 11 and 12 is proportional to the rate of change of current being detected, this rate of change of current is also known as the first-time derivative of current, or di/dt, or change in current with respect to change in time.

In step 430, the first Rogowski current sensor 11 generates a signal proportional to di/dt of the primary winding 23, while the second Rogowski current sensor 12 generates a signal proportional to di/dt of the secondary winding 24 that corresponds to a sum of the secondary outgoing current flowing through the first secondary conductor 28 and the secondary incoming current flowing through the second secondary conductor 30.

In step 440, the integrator circuit 13 receives the indicative signal of the primary current generated by the first Rogowski current sensor 11 and the indicative signal corresponding to the sum of the secondary current generated by the second Rogowski current sensor 12 for integrate them and generate an output signal proportional to the primary current and an output signal proportional to the secondary current.

In step 450, the controller 14 receives the output signal proportional to the primary current and the output signal proportional to the secondary current generated by the integrator circuit 13 to obtain a transformation ratio in operation of the transformer 10 and compare the transformation ratio in operation of transformer 10 with the pre-established transformation ratio threshold, to then, in step 460, determine if the transformation ratio in operation of transformer 10 exceeds the pre-established transformation ratio threshold, so if so, it continues in step 470 where the controller 14 sends a fault signal between windings to the local or remote monitoring unit (not shown) through the communication module 16, and if not, it continues from step 420.

From the embodiments described above, it follows that the method 400 for identifying a fault in windings of a distribution transformer in accordance with the present invention is applicable to any configuration and number of phases of distribution transformer 20, as seen in all embodiments described here.

Based on the embodiments described above, it is contemplated that modifications to the described embodiments, as well as alternative embodiments, will be considered apparent to a person skilled in the art under the present description. It is therefore contemplated that the claims cover such modifications and alternatives as are within the scope of the present invention or their equivalents.

The invention claimed is:

1. An apparatus for identifying a fault in windings of a distribution transformer having at least one high-voltage incoming current terminal connected to a primary winding, and at least one low-voltage outgoing current terminal and one low-voltage incoming current terminal connected to a secondary winding, the apparatus includes:

a first Rogowski current sensor adapted to be placed on a primary conductor connected to a high-voltage incoming current terminal to detect a primary incoming current to the primary winding and generate an output indicative signal of the primary current;

a second Rogowski current sensor adapted to be placed in tandem on a first secondary conductor connected to a low-voltage outgoing current terminal and on a second secondary conductor connected to a low-voltage incoming current terminal to detect a total secondary outgoing current of the secondary winding and generate an output indicative signal of the secondary current;

an integrating circuit in connection with the first Rogowski current sensor and the second Rogowski current sensor and adapted to receive the output indicative signal of the primary current and the output indicative signal of the secondary current to integrate them and generate an output signal proportional to the primary current and an output signal proportional to the secondary current;

a programmable memory for storing and pre-establishing an allowed transformation ratio threshold;

a communication module linked to a local or remote monitoring unit; and a controller connected to the integrating circuit, to the programmable memory and to the communication module; wherein the controller is adapted to receive the output signal proportional to the primary current and the output signal proportional to the secondary current to obtain a transformation ratio in operation of the distribution transformer and compare the transformation ratio in operation of the distribution transformer with the allowed transformation ratio threshold of the distribution transformer stored in the programmable memory, and adapted to send a fault signal between windings to the local or remote monitoring unit through the communication module, when the transformation ratio in operation of the distribution transformer exceeds the allowed transformation ratio threshold of the distribution transformer.

2. The apparatus of claim 1, wherein the first secondary conductor connected to the low-voltage outgoing current terminal passes one direction through the second Rogowski current sensor, and the second secondary conductor connected to the low-voltage incoming current terminal passes in the opposite direction through the second Rogowski current sensor.

3. The apparatus of claim 1, wherein further includes a user interface module in connection with the controller.

4. A distribution transformer comprising:
at least one high-voltage incoming current terminal connected to a primary winding;
at least one low-voltage outgoing current terminal and one low-voltage incoming current terminal connected to a secondary winding;
a first Rogowski current sensor adapted to be placed on a primary conductor connected to a high-voltage incoming current terminal to detect a primary incoming current to the primary winding and generate an output indicative signal of the primary current;
a second Rogowski current sensor adapted to be placed in tandem on a first secondary conductor connected to a low-voltage outgoing current terminal and on a second secondary conductor connected to a low-voltage incoming current terminal to detect a total secondary outgoing current of the secondary winding and generate an output indicative signal of the secondary current;
an integrating circuit in connection with the first Rogowski current sensor and the second Rogowski current sensor and adapted to receive the output indicative signal of the primary current and the output indicative signal of the secondary current to integrate them and generate an output signal proportional to the primary current and an output signal proportional to the secondary current;
a programmable memory for storing and pre-establishing an allowed transformation ratio threshold;
a communication module linked to a local or remote monitoring unit; and
a controller connected to the integrating circuit, to the programmable memory and to the communication module; wherein the controller is adapted to receive the output signal proportional to the primary current and the output signal proportional to the secondary current to obtain a transformation ratio in operation of the distribution transformer and compare the transformation ratio in operation of the distribution transformer with the allowed transformation ratio threshold of the distribution transformer stored in the programmable memory, and adapted to send a fault signal between windings to the local or remote monitoring unit through the communication module, when the transformation ratio in operation of the distribution transformer exceeds the allowed transformation ratio threshold of the distribution transformer.

5. The distribution transformer of claim 4, wherein the first secondary conductor connected to the low-voltage outgoing current terminal passes one direction through the second Rogowski current sensor, and the second secondary conductor connected to the low-voltage incoming current terminal passes in the opposite direction through the second Rogowski current sensor.

6. The distribution transformer of claim 4, wherein further includes an user interface module in connection with the controller.

7. A method for identifying a fault in windings of a distribution transformer having at least one high-voltage incoming current terminal connected to a primary winding, and at least one low-voltage outgoing current terminal and one low-voltage incoming current terminal connected to a secondary winding, the method includes the steps of:
pre-establishing an allowed transformation ratio threshold for the distribution transformer;
detecting, by at least one first Rogowski current sensor, a primary current flowing through a primary conductor connected to a high-voltage incoming current terminal;
detecting, by at least one second Rogowski current sensor, a total secondary outgoing current flowing through a first secondary conductor connected to a low-voltage outgoing current terminal and a second secondary conductor connected to a low-voltage incoming current terminal;
generating, the first Rogowski current sensor, an output indicative signal of the primary current of the primary winding;
generating, the second Rogowski current sensor, an output indicative signal of the secondary current of the secondary winding;
integrating the output indicative signal of the primary current and output indicative signal of the secondary current, and generating an output signal proportional to the primary current and an output signal proportional to the secondary current;

obtaining a transformation ratio in operation of the distribution transformer;
comparing the transformation ratio in operation of the distribution transformer with the allowed transformation ratio threshold;
determining if the transformation ratio in operation of the distribution transformer exceeds the allowed transformation ratio threshold; and
sending a fault signal between windings to a local or remote monitoring unit, upon determining that the transformation ratio in operation of the distribution transformer exceeds the allowed transformation ratio threshold.

\* \* \* \* \*